(12) United States Patent
Dana et al.

(10) Patent No.: US 6,392,229 B1
(45) Date of Patent: May 21, 2002

(54) AFM-BASED LITHOGRAPHY METROLOGY TOOL

(75) Inventors: Stephane Dana, Tel Aviv (IL); Joseph Bach, Morgan Hill, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/228,930

(22) Filed: Jan. 12, 1999

(51) Int. Cl.⁷ .............................................. G01N 13/16
(52) U.S. Cl. .................................... 250/306; 250/423 F
(58) Field of Search ................................ 250/306, 307, 250/423 F

(56) References Cited

U.S. PATENT DOCUMENTS

| | | | |
|---|---|---|---|
| 4,724,318 A | 2/1988 | Binnig | 250/306 |
| 5,117,110 A | 5/1992 | Yasutake | 250/306 |
| 5,189,906 A | 3/1993 | Elings et al. | 73/105 |
| 5,298,975 A * | 3/1994 | Khoury et al. | 250/306 |
| 5,418,771 A * | 5/1995 | Kasanuki et al. | 250/307 |
| 5,508,517 A * | 4/1996 | Onuki et al. | 250/306 |
| 5,666,190 A | 9/1997 | Quate et al. | 355/71 |
| 5,798,529 A | 8/1998 | Wagner | 250/492.2 |
| 5,976,740 A * | 11/1999 | Ausschitt et al. | 430/30 |
| 6,043,496 A * | 3/2000 | Tennant | 250/492.2 |
| 6,128,089 A * | 10/2000 | Ausschitt et al. | 356/401 |

FOREIGN PATENT DOCUMENTS

WO      98/30866      7/1998      ............ G01B/5/28

OTHER PUBLICATIONS

Semicon Daily News; Digital Instruments Responds To Demand For Automated In–Fab Measurements With Dimension 7000 Auto Wafer SPM; p. 58; Tuesday, Jul. 11, 1995.
Sematech Official Dictionary Rev 5.0, 1998.

* cited by examiner

Primary Examiner—Bruce Anderson
(74) Attorney, Agent, or Firm—Sughrue, Mion, Zinn, MacPeak & Seas

(57) ABSTRACT

A photolithographic track system for semiconductor wafer manufacture, that includes an Atomic Force Microscope (AFM), having a scanning stylus probe measurement device coupled to the AFM head, for measuring overlay between masks and layers in an inspected wafer, so as to generate overlay data. The AFM is situated in-track.

45 Claims, 9 Drawing Sheets

AFM-BASED LITHOGRAPHY METROLOGY TOOL

FIELD OF THE INVENTION

The present invention relates to a semiconductor manufacturing method and system and more particular to a method and system that includes monitoring and quality control constituents such as overlay (OL) and critical dimension (CD) tools.

REFERENCES

There follows a list of references that is referenced in the following description.
1. http://www.sematech.org/public/dict/home.htm
2. http://www.encyclopedia.com/articles/13734.html
3. http://www.fullman.com/semiconductors/index.html
4. http://www.veeco.com/metrology.html
5. U.S. Pat. No. 4,724,318 February 1988 Gerd K. Binning
6. U.S. Pat. No. 5,189,906 March 1993 Elings et al
7. U.S. Pat. No. 5,666,190 September 1997 Quate and Minne
8. http://www.york.ac.uk/org/esca/tech/afm.html
9. http://home.ee.umanitoba.ca/~spm/index.html
10. http://www.topometrix.com/afmodes1.htm
11. http://www.a1.com/asm/afmpage.htm
12. http://spm.aif.ncsu.edu/papers/characterizer.htm
13. http://www.lucent.dk/press/1297/971210.blab.html
14. U.S. Pat. No. 5,798,529 August 1998 Wagner
15. U.S. Pat. No. 5,117,110 May 1992 Masatoshi
16. W.O. Patent 98/30866 January 1998 Samsavar et al.
17. http://www.laurin.com/DataCenter/Dictionary/CD/df/fibeopfa.htm
18. Semicon daily news, Jul. 11, 1995 Page 58 Digital Instruments Dimension™ 7000 Autowafer™ AFM Glossary

| Term | Definition |
|---|---|
| AFM | Atomic Force Microscopy |
| CAD | Computer Aided Design |
| CD-SEM | Critical Dimension Scanning Electron Microscopy |
| CMP | Chemical-Mechanical Planarization or Polishing |
| Critical Dimension | (CD) The width of a patterned line or the distance between two lines, monitored to maintain device performance consistency; in general, the dimension of a specified geometry that must be within design tolerances [1], in microelectronic manufacturing CD is defined as the smallest width of a line or the smallest space between two lines which is to be permitted in the fabrication of a integrated circuit or "chip". |
| Die | A small piece of silicon wafer, bounded by adjacent scribe lines in the horizontal and vertical directions, that contains the complete device being manufactured. [1] Also called chip and microchip. Also: An individual device cut from a wafer before it is packaged. |
| Fab | The main manufacturing facility for processing semiconductor wafers. [1] |
| Fiber Optic Faceplate | A plate made up of thousands of glass fibers arranged parallel to one another, i.e., in a coherent bundle, and fused together so that it is hermetically tight. It transfers an image from one plane to another. [16] |
| FEM | Focus Exposure Matrix |
| Metrology | Metrology is the science of measurement of standards and methods, using units and standards for expressing the amount of some quantity, such as length, capacity, or weight [2]. |
| overlay | (OL, OVL) The precision with which successive masks can be aligned vis-a-vis with previous patterns on a silicon wafer [1]. |
| Photo-lithography | A process in which a masked pattern is projected onto a photosensitive coating that covers a substrate. [1] Light is shined through the non-opaque portions of a pattern, or photomask, onto a piece of specially coated silicon or other semiconductor material. The portions of the coating that were exposed to light harden, and the unhardened coating is removed, as by an acid bath. The uncovered silicon is altered to produce one layer of the integrated circuit. Advances in this technique have replaced visible and ultraviolet light frequencies with electron and X-ray beams, which permit smaller feature sizes in the patterns. Also called "photo", "litho" and "lithography". |
| Photoresist | A radiation-sensitive material that, when properly applied to a variety of substrates and then properly exposed and developed, masks portions of the substrate with a high degree of integrety. [1] The resist is poured onto the wafer in a liquid, viscous state, spun to a uniform thickness, exposed to a device pattern using a lithography process and developed. During developing, exposed portions of positive resist are removed leaving a "positive" image of the mask pattern on the surface of the wafer. Although rarely used today, a negative resist process removes unexposed portions of the photoresist leaving a "negative" image. |
| Recipe | (In IC manufacturing:) computer program that controls the various steps of manufacture. The term is also used in connection with i.a. prescriptions, procedures, and chemical composition of the various baths. |
| SCM | Scanning Capacitance Microscopy |
| Semiconductor | An element that has an electrical resistivity in the range between conductors (such as aluminim) and insulators (such as silicon dioxide). Integrated circuits are typically fabricated in semiconductor materials such as silicon, germamium, or gallium arsenide. [1] By doping with impurities, it can be made slightly conductive (n-type) or slightly insulative (p-type). |
| Stepper | Equipment used to transfer a reticle pattern onto a wafer [1]. The device that exposes a photoresist coated wafer surface using one or more reticle masks. The term derives from the operation of making small x- and y-axes step offsets to align the reticle(s) with each die position. |
| Track | Area where various stations are situated performing manufacturing steps such as coating, cleaning, stripping, etc. |
| Wafer | A thin slice with parallel paces cut from a semiconductor crystal [1]. Also: a silicon disc, commonly (but not confined to) ¹⁄₄₀" thick and anywhere from 75 mm (3") to 300 mm (12") in diameter, used to form the substrate of a device. During manufacturing, a wafer may contain several hundred devices. Each individual device on a wafer is called a die. |

BACKGROUND OF THE INVENTION

The ongoing trend of increasing the density of semiconductors in order to answer to today's need for ultra-large scale integrated (ULSI) semiconductor devices has led to the urgency of advanced monitoring and quality control of each and every step of the semiconductor manufacturing process. Particularly, the monitoring of the photolithographic step is becoming increasingly important.

There follows a description of prior art that is related to the photolithographic process.

After creation of polysilicon, crystal pulling, wafer slicing, lapping and polishing, and after wafer epitaxial processing (for more details, attention is directed to the semiconductor manufacturing process on the Fullman Company Website [3]), the wafer is transported to the lithography station.

Resist coating, development, alignment and exposure are the main steps in the photolithographic process that transfers the circuit pattern for one layer from a photomask or reticle onto the light-sensitive photoresist on the wafer surface.

Attention is directed to FIG. 1, which is a schematic representation of a typical track where the lithography steps are performed.

The track 10 is in principal, a platform on which a multiple of stations that perform specific tasks are situated. The wafer is usually part of a batch of wafers, loaded in a cassette, containing a number (e.g. 25 units) of wafers. The cassette is loaded onto the track at the loading station 11. From here, a centralized robotic arm 12 will move one wafer at the time from one station to another station under the control of a "recipe" or computer program that defines the procedures a wafer has to undergo during the photolithography.

At the onset, the robotic arm transports the wafer to the center alignment station 13. Here, the wafer is precisely positioned to ensure the wafer is situated concentrically. (Optionally, the wafer is returned at various points during the photolithographic step back to this station for critical re-alignment). The wafer is then transported to a cleaning station 14, to ensure maximum surface cleanness before being moved to the coating station 15. Here the photoresist is deposited on the wafer in a predefined amount of viscous fluid. The photoresist is thinly distributed evenly over the total surface of the wafer by means of fast spinning. The wafer is then transported optionally to a pre-baking station. The pre-baking is in effect a thermal oven that hardens the still very soft photoresist layer. In the stepper 17 the image of the mask or reticle is projected onto the wafer using actinic light (UV, usually UV of very short wavelength— "deep-UV" or DUV), thus exposing the photoresist. The wafer is then moved in the stepper in either or both x- and y-directions by a pre-defined number of "steps" (hence the name "Stepper"). This process is being repeated as many times as number of dies that are to be positioned on the wafer (step and repeat). The wafer is then transported back to the track to the developing station 18 where an acid or base solution is used to remove those parts of the photoresist that became soluble by exposure. The wafer is then subjected to metrology inspection by transporting a wafer to be inspected to the unloading station 20 and from there to the stand alone inspection station. Should the inspection result in detection of defects, errors or misalignments, the wafer is optionally returned to the loading station 11 of the track from where the wafer is transported to the stripping station 21. Here a suitable solvent removes the photoresist layer. The wafer can then be transported back to the alignment 13 or cleaning station 14 for "rework" (e.g. the process of repeating the previous, not successful manufacture steps). The following optional step is another baking station 19, also called post-baking station where further hardening of the remaining photoresist layer occurs. The manufacturing steps that follow the photolithography are not further discussed here, as they are not relevant to the present invention.

There follows now a description of the metrology inspection used in the prior art.

Attention is directed to FIG. 2, which is a schematic representation of OL and CD measurement procedures, according to the prior art. Two metrology inspection methods that are commonly used to determine the quality of the photolithography step are:

1. The overlay (OL) inspection measures the registration of consecutive layers of multiple-layer semiconductor chips. During the OL inspection, a wafer is extracted from the stepper 23 and moved to an optical microscope 24 where the position of marks or targets of the previous processed layer are measured against the marks of the layer that is currently being added.

2. The Critical Dimension (CD) inspection measures linewidths of the layer. During the CD inspection, a wafer is extracted from the track 25 and moved to a high-resolution CD-SEM 26, where the line width is measured and determined to be within pre-determined tolerances. The arrows 27 indicate the transportation from the stepper and track to the inspection tools and back.

There follows now a description of the Related Art of how a known per se CD-SEM may be used by means of example of checking CD with the help of a FEM.

In the fabrication of semiconductor devices, photolithographic masks are used to transfer circuitry patterns to silicon wafers in the creation of integrated circuits. In general, in the production of semiconductor circuit devices, a series of such masks are employed in a preset sequence.

Each photolithographic mask includes an intricate pattern of CAD-generated geometric patterns corresponding to the circuit components to be integrated onto the wafer. Each mask in the series is used to transfer its corresponding pattern onto a photosensitive layer (photoresist) which has been previously deposited on the silicon wafer. The transfer of the mask pattern onto the photosensitive layer or photoresist is currently performed by an optical exposure tool, which directs light or radiation through the mask to the photoresist.

Fabrication of the photolithographic mask follows a set of predetermined design rules, which are set by processing and design limitations. For example, these design rules define the space tolerance between devices or interconnecting lines, and the width of the lines themselves, to ensure that the devices or lines do not overlap or interact with one another in undesirable ways. The design rule limitation is referred to within the industry as the "CD" (critical dimension). The critical dimension of a circuit is defined as the smallest width of a line or the smallest space between two lines, which is to be permitted in the fabrication of the chip. More often than not, the CD is determined by the resolution limit of the exposure equipment. Presently, the CD for most applications is on the order of a fraction of a micron. Because of the extremely small scale of the CD, the instrument of choice for measurement and inspection is a scanning electron microscope (SEM).

When new masks are produced, or after any change in the fabrication recipe, it is customary to form a so-called focus exposure matrix (FEM) on a test wafer in order to obtain the best exposure/focus combination for the mask, e.g., the combination of focus and exposure which results in the best resolution on the wafer, in keeping with the required CD. This is typically done by, for example, sequentially exposing a series of areas of the wafer with the pattern of the mask, while exposure and focus values are incrementally changed from one exposure location to the next. After exposure of the wafer in this fashion, one can examine the individual exposure sites, for example, to check the CD, and obtain a plot of exposure v. focus or focus v. CD and determine the area of best performance from the resulting curves. Specifically, a test wafer is exposed in a stepper while the focus is varied along one axis and the exposure is varied along the other. Thus, a matrix of images is obtained on the exposed wafer, wherein each exposure site or die has a different focus-exposure setting. Selected CDs (at various locations) in each die are measured to select the best exposure-focus setting for the particular mask.

The general procedure for determining the CD in a test wafer is as follows. First, an alignment target (which is not part of the circuitry) is included on the mask, typically at an area, which will not include circuit patterns. During exposure, an image of the alignment target is transferred onto each of the dies. When the test wafer is developed and loaded into the CD measurement machine (typically a CD SEM) the operator first causes he system to acquire the alignment target of the central or reference die of the wafer. The image of this alignment target is stored in memory for reference. The operator then acquires an appropriate area for CD measurement, and designates that area to the CD machine. The machine automatically calculates a vector from the center of the alignment target to the center of the designated area. This procedure is repeated for each area, which the operator wishes to measure. The foregoing procedure can be performed in what might be designated as a "teaching mode" of the CD SEM. Once all of the data has been input and the vectors calculated, the CD system might then be enabled for automated CD measurement as described below.

When the developed wafer is properly loaded into the CD machine, the machine moves to the first die to be inspected and searches for the alignment target using a pattern recognition (PR) algorithm, using the aforementioned stored alignment target as a reference. When a high PR score is achieved, it is considered that the alignment target has been acquired. Using the stored vector, the CD machine then moves to the designated CD measurement site and acquires an image for CD measurement, which is then performed. Following this procedure, which may be duplicated for other locations on the die, the CD machine then goes to the next die and again using the PR algorithm searches for the alignment target using the stored target as a reference. Once a high PR score is achieved, the CD machine goes to the CD measurement site using the stored vector. This process is repeated until all of the designated dies have been measured.

After having described an example of CD-SEM usage, prior art limitations of OL and CD procedures are discussed.

In prior art, the inspection of a batch of wafers during the photolithograpy step has been executed on a sampling bases only, due to the inherent prolonged and cumbersome process of inspection, which necessitates actual removal of the inspection wafer from the track and feeding the wafer to the overlay machine. (The latter naturally requires preliminary set-up and alignment steps in order to assure that the wafer is accurately placed before the overlay procedure commences. The same applies to the operation of the CD-SEM.

It was accordingly accepted that if no errors were detected in the sample wafer then, the other wafers in the batch were also without problems. Thus, the batch was transferred to the consecutive steps in the manufacturing process, i.e. etching, deposition or ion implantation. At this point any further processing would represent a point of "no return" in the whole chain of manufacturing steps. Until this point, the detection of errors or defects would initiate a "rework" process that includes stripping the resist coating off the wafers, and returning the wafers to the beginning of the photolithographic step. Except for some decrease in throughput, and minimal waste of photoresist coating, exposure means and developer, no further damage occurred. To show the importance of monitoring the photolithographic step, a worst-case scenario would describe the adding of the last layer of a multi-layer semiconductor while errors or defects are introduced undetected, and proceeding with the following step. Up and until this point, the previous step is reversible, if said errors or defects were detected by inspection at this point, thus preserving all previous layers and the time and materials it took to manufacture them. It is of importance to mention that due to the fact that wafers are inspected only by sample, the loss of time and materials can accumulate to significant proportions, as detection of errors or defects is usually executed after a batch of wafers has completed the photolithographic step. Thus, in case of errors or defects, all wafers of the batch exhibited the same problem. By not inspecting each wafer individually, errors or defects were repeatedly produced.

Some issues that are not being addressed by prior art procedures of OL and CD inspection:

1. By using the sampling method, no data is being generated about the rest of the wafers in the same batch.
2. The handling of samples from the track to the stand-alone OL or CD-SEM apparatus is time consuming and can introduce contamination and mechanical damage due to wafer handling. (FIG. 2).
3. The number of available inspection tools per photolithographic station, typically about one OL tool per four photolithographic stations, causes bottleneck situations, which substantially adversely affect throughput.
4. The introduction of advanced photomasks for subwavelength (beyond 0.25 micron) integrated circuit (IC) manufacturing, reaching the envelope of optical OL capabilities, thus bringing about a substantial decrease of optical image quality, and consequently, rendering the conventional OL tools less and less useful.
5. The increasingly frequent use of CMP (Chemical Mechanical Planarization—a technique to flatten the surface of the added layers of conductive or insulating materials) induces low-contrast images, which lowers the accuracy of optical OL measurement systems. This flattening reduces the average height of a layer-line to approach the envelope of optical OL capabilities, thus bringing about a substantial decrease of optical image quality. It is important to notice that the current trend of even more reduction of average height of layer lines will go beyond the envelope of optical OL capabilities, thus severely limiting the conventional optical OL tools.
6. Contamination of wafer due to exposure to electron beam when a sample is being objected to CD-SEM inspection.
7. Submitting the wafer to vacuum during the CD-SEM inspection is a time consuming step, using complex equipment and setup.
8. TIS (Tool Introduced Shift) errors of optical microscope in OL measurements.

Although both overlay and CD monitoring measurements are similar in the metrology used, there has been no prior art solutions found for using one and the same tool for both tasks. Moreover, it is not apparent how to go about combining both tasks since traditional CD-SEM and overlay equipment have different requirements (e.g., electron optics and vacuum for CD-SEM and light optics with no vacuum for overlay). Due to sever space limitations traditional CD-SEM and/or overlay cannot be placed in the track. Current overlay and CD-SEM systems are designed to provide absolute measurements. For monitoring a production line however, it may be sufficient only to monitor changes even if the absolute values are unavailable.

There is accordingly a need in the art to provide for a system that substantially reduces or eliminates the limitations in hitherto known solutions. In particular, there is a need in the art to incorporate OL and/or CD measurements within the track on a one-to-one sampling bases (necessitating NDT—Non Destructive Testing—mode), thereby obtaining overall throughput increase, and a higher yield.

SUMMARY OF THE INVENTION

The solution provided is a small unit that can be fitted onto the track, it is capable of monitoring both CD-SEM and overlay. Moreover, the system is further useful for monitoring purposes and can provide measurements of changes in the production line. The solution, according to the invention, is particularly advantageous since it requires no vacuum, yet it has a very high resolution.

According to the invention, there is provided a method and a system for photolithography metrology, using a track-integrated monitoring module comprising of an Atomic Force Microscope (AFM) which provides overlay and CD monitoring for accomplishing complete Lithography Control/Resist Inspection in-track.

In a preferred embodiment of the present invention, the AFM monitoring module is integrated into the photolithographic track past the development station prior to unloading the cassette containing a batch of wafers from the track.

It is an important finding of the present invention that the utilization of a readily, commercially available AFM facilitates an in-track OL and CD.

As is well known, an AFM employs a stylus probe for acquiring is profiles. Due to the physical geometry of the stylus probe, it may oversee or distort certain patterns of the inspected surface. An example of the former is a narrow trench and of the latter is a sidewall slope normal to the inspected surface. Accordingly, using the AFM for measuring CD and/or OL introduces tool induced shifts.

It has been proposed in [4] to employ a modified AFM which includes a two-dimensional vibrating stylus probe in order to overcome the inherent drawback of AFM as explained above. This solution is not only cumbersome but involves also significant modifications in the AFM with the inevitable consequence that commercially available AFM cannot be utilized for CD and/or OL measurements. Another modified AFM for lithographic metrology inspection is for instance the Dimension™ 7000 AutoWafer™ AFM made by Digital Instruments. Application examples, system additions, such as pattern recognition are mentioned in the Semicon Daily News of Jul. 11, 1995 on Page 58 [18].

As will be explained below, and unlike the prior art, a commercially available AFM can be utilized for CD and or OL measurements by detecting variations between various measurements thereby eliminating the before mentioned TIS.

Traditional, prior art AFM is inherently relatively slow, but as will be explained below, there are provided techniques to increase its speed, e.g. using more than one AFM fitted onto the track.

According to one embodiment, a known per se algorithm is utilized for calculating the center of said shape from said profile. As will be explained in detail below, the distance between two centers of two shapes is representative of the registration between the two shapes and which is the objective of the OL inspection. If the specified distance exceeds a given threshold, an appropriate error indication is triggered.

Turning now to a CD monitoring using an AFM, it is achieved according to the preferred embodiment by using the specified inherent capability of the AFM to obtain a relative but accurate representation of the shape being inspected in the form of a profile. Consecutive measurement will generate a profile that is compared to a previous one. Thus, the comparison between the two profiles indicates a change of shape representative of change in CD.

As is well known, the space that a typical CD-SEM occupies in the clean room, where the track is situated, is by any standard considerably large. In contrast, the AFM is significantly smaller in size which not only allows to use it in clean room, saving thus precious space, but also enables to use it as a station on the track, which as will be explained below brings about many advantages.

It is accordingly appreciated that unlike conventional CD inspection, by using an AFM inside a track, CD variations are measured, and in the case that the so obtained change exceeds a given threshold, an appropriate error indication is triggered.

The utilization of a CD and OL procedure of the invention does not necessarily obviates the use of conventional OL and CD-SEM tools. Thus, according to one embodiment, when variations in CD occur, the wafer(s) can be transferred to a high resolution CD-SEM.

Accordingly, the present invention concerns:
1. A photolithography track system for semiconductor wafer manufacture, comprising:
   (a) an Atomic Force Microscope (AFM) that includes: a scanning stylus probe measurement device for measuring overlay between masks and respective layers in an inspected wafer, so as to generate overlay data;
   (b) said AFM situated in-track.
2. A photolithography track system for semiconductor wafer manufacture, comprising:
   (a) an Atomic Force Microscope (AFM) that includes: a scanning stylus probe measurement device for measuring Critical Dimension (CD) variations between lines in layers of an inspected wafer, so as to generate CD data;
   (b) said AFM situated in-track.

BRIEF DESCRIPTION OF THE DRAWINGS

In order to understand the invention and to see how it may be carried out in practice, a preferred embodiment will now be described, by way of non-limiting example only, with reference to the accompanying drawings, in which.

DETAILED DESCRIPTION OF A PREFERRED EMBODIMENT

There follows now a description of usage of a known per se AFM (with reference also to FIG. 3) which, as will be explained briefly below, is utilized in the preferred embodiment of the present invention for OL and/or CD inspection. For technical background about the AFM and related publications referral is made to U.S. Pat Nos. 4,724,318; 5,189,906; and 5,666,190 [5][6][7], incorporated here by reference.

Scanning probe microscopy (SPM) refers to several techniques that use the interaction of a microscopic stylus probe 28 with the surface 29 of a sample to measure characteristics of the sample surface at localized points. A fine tip (30) is brought into atomically close contact with a sample surface without actually touching the surface 29. By means of sensing the repulsive force between the stylus probe tip and the surface a signal is generated that is used to keep a constant distance between the tip and the surface. This mode is called Non-Contact Mode A. The forces are extremely small (about 1 nanonewton). The tip is then moved back and forth over the sample surface and can measure the topography with almost atomic resolution [8]. By scanning the sample with the stylus probe in a two-dimensional pattern (like an electron beam scans a television screen), an image of the sample can be produced, sometimes up to atomic scale resolution. Depending on the nature of the interaction, the image may represent the topography, magnetic properties, electrical properties, etc. of the sample [9].

Figure 1:
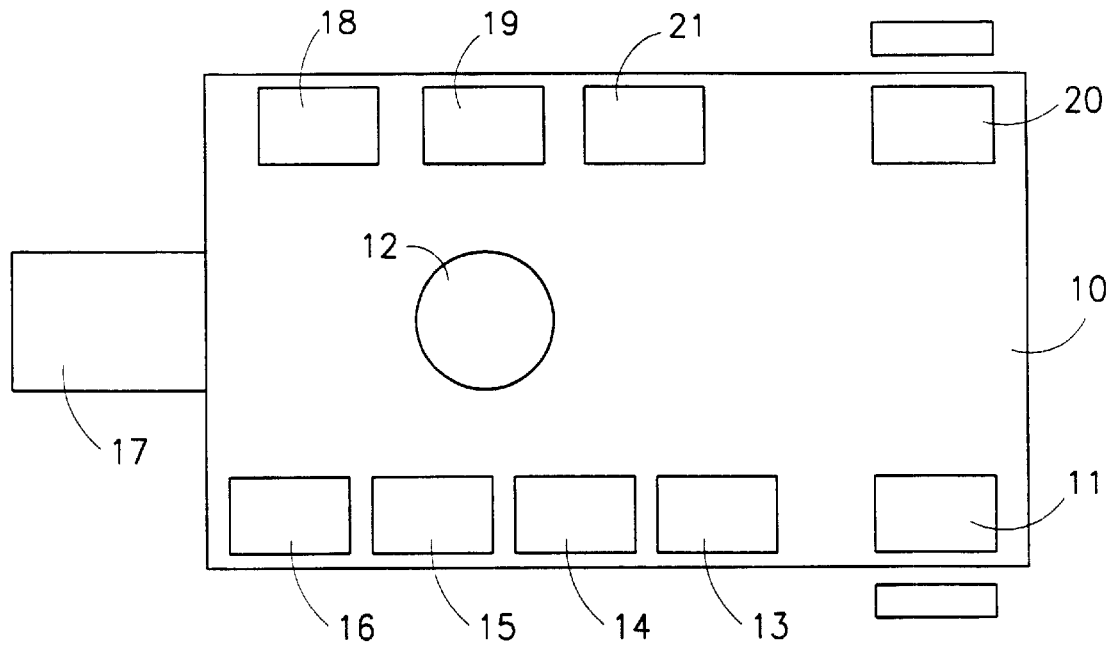
FIG. 1 is a schematic representation of a typical track where the lithography steps are performed.
Figure 2:
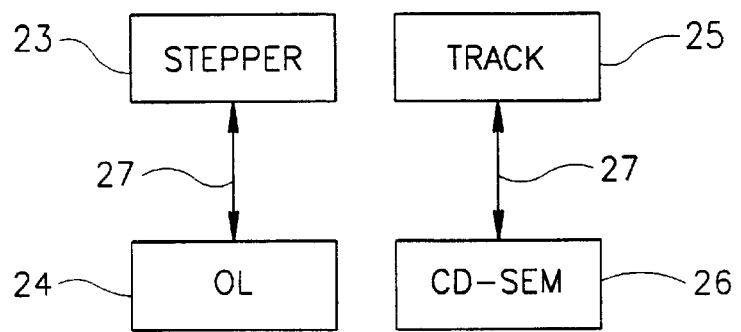
FIG. 2 is a schematic representation of OL and CD measurement procedures, according to the prior art.
Figure 3A:
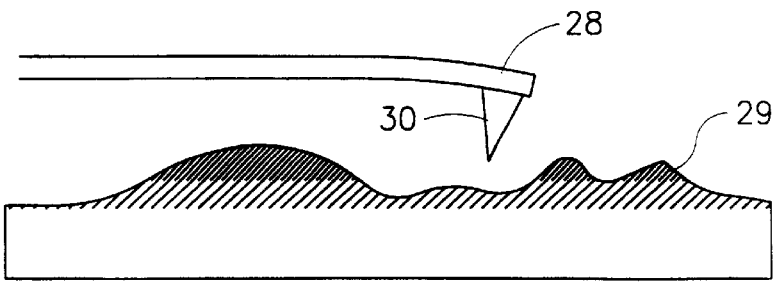
FIGS. 3A–B are two pictorial representations of the "non-contact" mode and "contact" mode respectively of an AFM stylus probe.
Figure 3B:
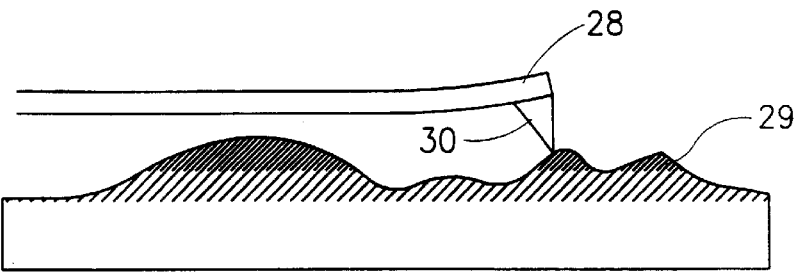

The scanning probe microscope (SPM) and more specifically the atomic force microscope (AFM) can be operated in many ways. These different techniques provide a variety of capabilities for imaging different types of samples and generating a wide range of information. Imaging modes (sometimes referred to as "scan modes" or "operating modes") are the methods that are used to move the AFM stylus probe over the sample surface and sense the surface in order to create an image. There is a wide range of possible imaging modes, due to different interactions between the stylus probe tip 30 and sample surface 29, as well as the detection scheme used. The choice of the appropriate mode depends on the specific application [10]. In FIG. 3A represents the non-contact mode which is the mode the preferred embodiment of the present invention uses. Although it is slower than the contact mode B, it does not cause any contamination to the surface.

AFM images show critical information about surface features with unprecedented clarity. The AFM can examine any rigid surface in air. "Minor" (and major) differences on "smooth" surfaces are shown dramatically. On the other hand, the AFM can examine a field of view up to approximately 100 microns (0.004 inch), so that comparisons can be made with other information, e.g. features seen in the light microscope or hazes seen by eye. The AFM can also examine rough surfaces, since its vertical range is more than 5 microns [11].

Figure 4:
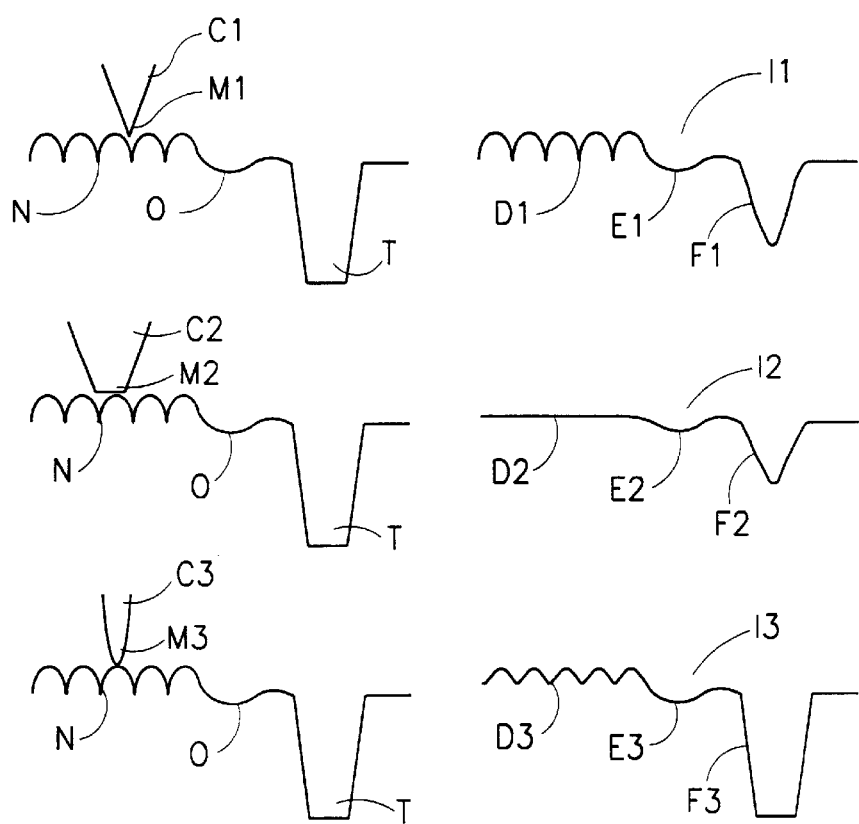
FIG. 4 illustrates schematically the inherent dependence of stylus probe geometry on the resulting image for various types of sample features.

The ability of the AFM to profile a surface is dependent on how the geometry of the stylus probe interacts with the geometry of the surface as illustrated schematically in FIG. 4. As shown here, the inherent dependence upon stylus probe geometry, especially the probe's radius and cone angle M1 of the probe has substantial influence on the resulting image for various types of sample features. Stylus probe C1 is sharp with low aspect ratio; probe C2 is blunt with low aspect ratio; stylus probe C3 is sharp with high aspect ratio. The image that would result from a scan of each stylus probe of different geometry is represented on the right by figures I1, I2 and I3. The stylus probe's radius and cone angle M1 allows C1 to profile without substantial distortions features N and O, resulting in images D1 and E1, respectively. This notwithstanding, the stylus probe's radius and cone angle prevent profiling the trench feature T without substantial distortions as F1 clearly shows. The radius and cone angle M2 of C2 prevent profiling correctly features N and T (resulting in D2 and F2 respectively) while still allowing feature O to be imaged (E2). Stylus probe C3 can image features O and T (D3 and E3) without substantial distortions but will introduce substantial distortions when imaging feature N as can be seen from D3. FIG. 4 thus illustrates how the geometry of the stylus probe determines the surface information content of an AFM image [12].

Having described in general the structure and manner of operation of an AFM, there follows a description of so-called Scanning Capacitance Mode of operation (SCM) of an AFM, which is also applicable to one embodiment of the invention thus broadening the scope of applications the AFM can be used in.

The AFM can be adapted to operate in capacitance mode by replacing the stylus probe by an appropriate capacitance type stylus probe. The capacitance mode of the AFM can be used in situations where a planarized dielectric layer (commonly a silicon dioxide layer) has been deposited between two layers.

Figure 5:
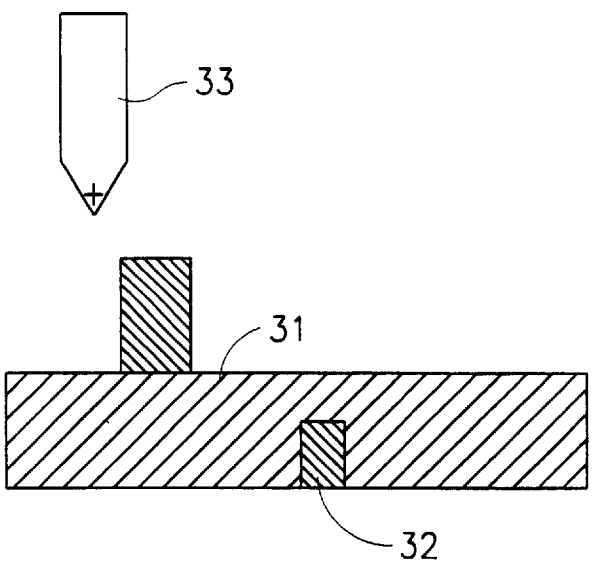
FIG. 5 is a schematic representation of the capacitance mode of an AFM when a planarized dielectric layer covers the surface of the wafer.

For a better understanding of the foregoing, attention is now directed to FIG. 5, showing a schematic representation of the capacitance mode when a planarized dielectric layer of insulating silicon dioxide covers the surface of the wafer. As shown, the planarized dielectric layer 31 and the wire 32 in a previous layer form together with the stylus probe of the AFM 33 (in this configuration, called SCM) a very small capacitor. At each point on the surface the capacitance is measured by a sensitive capacitance detection system, and the information is stored in a computer, fonning an image of the capacitance profile of the layer 32 below the dielectric layer 31 [13].

Having described the general structure and manner of operation of an AFM, the utilization thereof for overlay measurement will now be described with reference to FIG. 6. It should be noted that the present invention is by no means bound to the specific structure and manner of operation of an AFM as described with reference to FIGS. 3 and 5.

The overlay inspection measures the distances in x- and y-directions between successive marks situated in each layer pattern at precisely defined locations in the peripheral area of the wafer, used for several monitoring purposes such as, amongst others, overlay). Commonly, a pattern of four rectangular shapes, forming a box mark as depicted in FIG. 6 is used for overlay monitoring. The layer that has been deposited during the previous steps has similar box marks (either larger or smaller in size) at precisely the same location. It is therefore readily understood that when both layers are in place one on top of the other, a "box in a box" pattern is obtained, when observing from a perpendicular position. 34-1, 34-2, 34-3 and 34-4 represent four marks of a layer. 35-1, 35-2, 35-3 and 35-4 represent four marks of a layer, placed on top of previous layer. The OL metrology inspection comprises of measuring the distance between two marks in two directions, perpendicular to each other. By meeting predefined values, the measurement establishes if the two layers are in registration or not. Conventionally, the overlay inspection has been performed using an optical microscope and thus, the distance 36 between the marks is defined by measuring the distance between adjacent edges of the two marks 34-3 and 35-3 with the help of a metrical recticle inside the ocular of the microscope. Likewise, the distance 37 between the marks is defined by measuring the distance between adjacent edges of the two marks 34-4 and 35-4 with help of the metrical recticle inside the ocular of the microscope. In the present invention, an AFM with following procedure is used to obtain distance measurements, indicative of registration. As will be explained further on, the distance 36-1 between the centers of the marks 34-1 and 35-1 and the distance 37-1 between the centers of the marks 34-2 and 35-2 is measured and used as overlay data. This deviation of standard overlay procedures is necessary because an AFM is not capable of generating absolute edge detection as will be explained further on. The choice of using the specified adjacent marks in above example is not binding and anyone versed in the art will readily recognize a procedure of prior art overlay metrology.

Figure 7A:
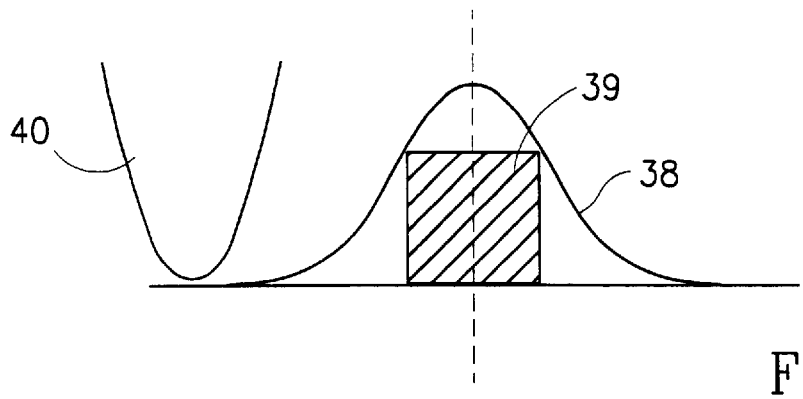
FIGS. 7–7C are schematic representations showing the procedure of center determination of a scanned mark and the distance determination of two overlay marks scanned by the stylus probe of an AFM, according to one embodiment of the present invention.
Figure 7B:
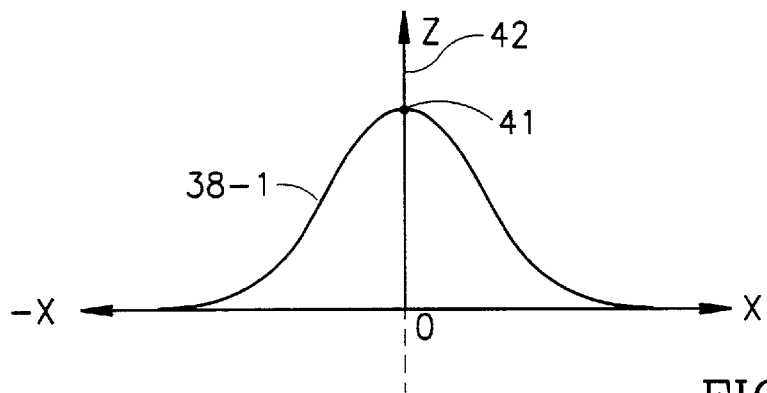

In FIG. 7A, 38 shows a pictorial representation of the surface scan information obtained by the stylus probe of the AFM according to one, non limiting embodiment of the invention. The surface scan information, or surface profile, is in effect an array of data representing the location of the stylus probe and the data that the stylus probe generated at that particular location. During the scanning of a mark 39, the stylus probe 40 and the mark 39 interact, and the resulting data is said profile 38 of the mark. A predefined number (typically, but not necessarily 10) lines are scanned and the resulting data is averaged. This data is generally structured as a series of XY values representing the coordinates of surface points and the corresponding Z values, representing the perpendicular height of the surface points. The data that is generated during the scanning of one line is thus a series of pairs of values representing one surface coordinate (the other half of the surface coordinates remains constant as the surface points are situated along the scan line) and the corresponding Z (height) value. Mathematically, the series of values can be represented as a uniform, continuous function 38-1 in FIG. 7B. It is appreciated to recognize that this function is substantially approximated by a function of the Gaussian type exhibiting inherent axe symmetry normal to the base. The point 41 where the symmetry axe 42 intersects with the function, is also the maximum. To sum up, the center of a scanline profile of a mark is thus coincidental with the abscissa value of thus obtained maximum. It is of importance to notice that the maximum is thus not dependent upon stylus probe geometry, meaning that the obtained data can be used as absolute data. Mathematically this can be shown by obtaining the first derivative of the Gaussian function. The generic Gaussian equitation:

$$G'(x) = x\left(-\frac{Ae^{-\frac{x^2}{2\sigma^2}}}{\sigma^2}\right) \quad G'(x) = 0 \text{ for } x = 0$$

(A=constant, σ=standard deviation or spread) exhibits maxima or minima where the first derivative is zero. The maximum is thus solely dependent on x. It is appreciated to notice that the stylus probe geometry is substantially represented in the equitation by the standard deviation.

Figure 7C:
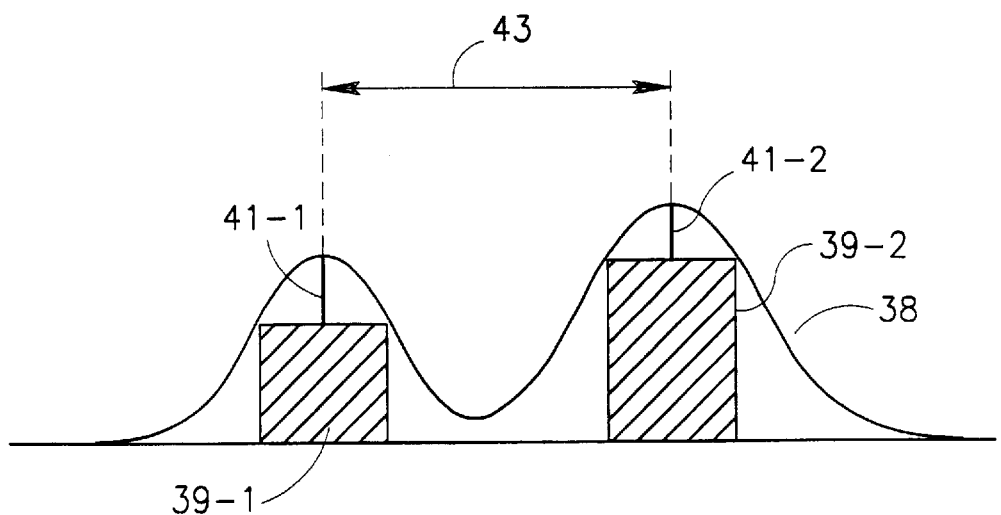

In FIG. 7C is shown how the distance between two marks is determined using the modified method. The distance 43 between the two center points 41-1 and 41-2 of respectively two marks 39-1 and 39-2 is thus indicative of the overlay in absolute terms.

Noticeable the overlay inspection using an AFM is thus modified in that the distances between the centers of marks are measured and not adjacent edges as in conventional optical inspection of overlay as described before.

Figure 6:
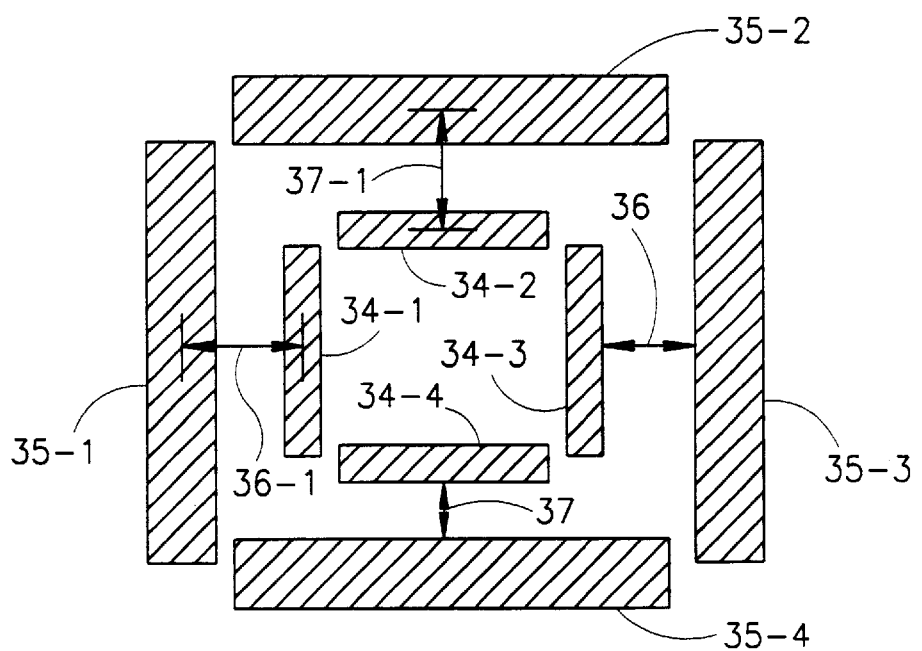
FIG. 6 is a schematic representation of overlay marks and the measurement of OL, according to one embodiment of the present invention.

In FIG. 6 the distance 36-1 between the centers of two marks 34-1 and 35-1 is calculated in the manner explained in detail above. In the same manner, the distance 37-1 is calculated between two marks 34-2 and 35-2 in the perpendicular direction. In a preferred embodiment of the present invention, the AFM is used as a process control tool that will monitor changes in distances 36-1 and 37-1.

Figure 9:
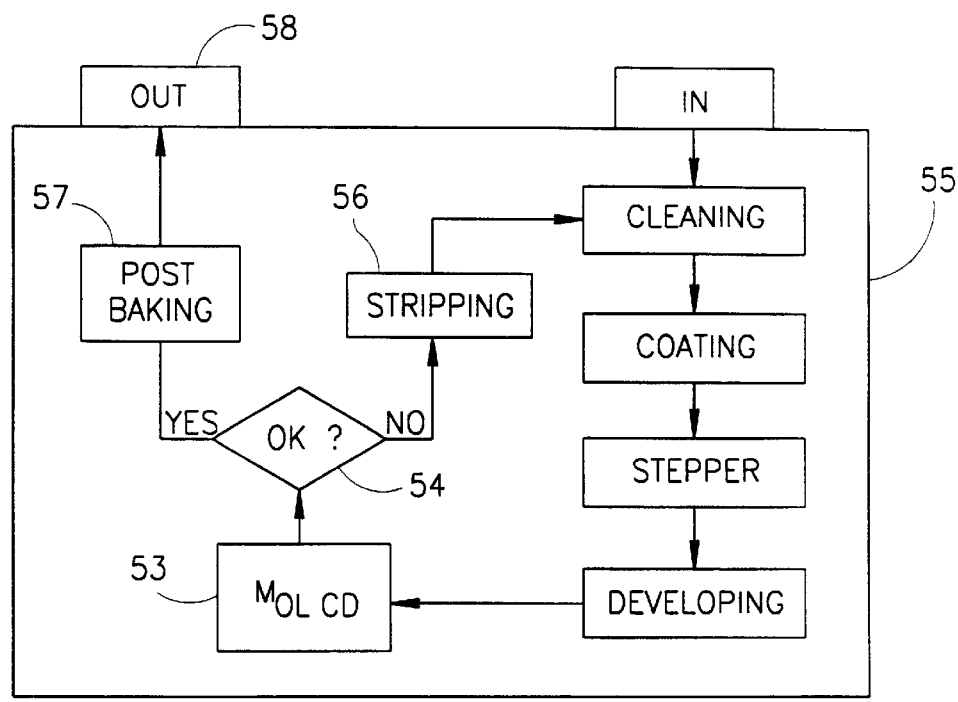
FIG. 9 represents a schematic flowchart of the photolithography step, where the AFM inspection tool is integrated in-track, according to one embodiment of the present invention.

A preferably, but not necessarily, there is provided a decision module e.g. 54 in FIG. 9 that is connected via a known per se interface module of an AFM 53 to receive overlay data from the AFM and generates preferably an indication that OL has changed. The decision module 54 can be part of a computer program or recipe that is run on e.g. a computer system that controls the electronics and robotics of the track 55. The interface module is preferably of the bidirectional type, meaning that data will flow in both directions, constituting bidirectional data links. AFM data from the AFM to external modules and positional data from further on discussed positioning controller module(s) into the AFM. If the decision module 54 determines that the distances have changed in value since the measurement of previous wafer, used as reference overlay data, the computer program checks if the change is within predefined tolerances. If the changes are not within the tolerances, an appropriate robotics command can be send to the track to move the wafer to the stripping station 56. Of course, the reference overlay data can be any set of values acquired by various methods of reference data assessment procedures. In addition, a correction signal is sent to the stepping electronics, representing the required change in stepper data in order to ensure that the following stepper sequence will be within predefined OL specifications. In the case that the changes are within the tolerances, the wafer is moved optionally to the post-bake station 57 or directly to the unloading station 58.

Regardless of whether the changes are within tolerances or exceed the tolerances, the distance (referred to also as overlay data) can optionally be logged and be used for trend analysis and equipment performance statistics to enhance MTBF (Mean Time Between Failure), Process Control optimization, etc.

Those versed in the art will readily appreciate that the present invention is by no means bound to the specific OL procedure described in FIG. 6 according to the implementation thereof as described with reference to FIG. 7. Obviously the present invention is not bound to the specific computation steps described with reference to FIG. 7.

It should be noted that one or more of the previous measurements and/or apriori stored data constitute reference OL data that serves for comparison against currently obtained OL data. In general, any set of values acquired by various methods of appropriate reference data assessment procedures can constitute reference data for above mentioned purpose. The indication that overlay data deviated from reference overlay data can be, for example, numerical, representing the difference between the current and recalled measurement or, according to another embodiment, binary, as a go/no-go signal to indicate that the distance has changed between current and recalled measurement. The overlay error indication is of course, not bound only to visual indication, but can be e.g. an audio binary indication as well, such as a buzzing tone. To validate and quantify the source of the error indication, the wafer may be optionally moved to a stand alone prior art overlay station.

Having described the utilization of an AFM for monitoring OL, there follows a description in connection with utilizing an AFM for CD (variation) monitoring.

As previously described, Critical Dimension (CD) measures the line width of the lines in the layer. Due to the very small dimensions of lines in modem semiconductors (0.25 $\mu$m) and in not too far future 0.18 $\mu$m (and even smaller), a CD-SEM has to be utilized to obtain precise data. In accordance with one embodiment of the present invention, an AFM with following procedure is used to obtain line width measurements, indicative of CD variation.

As has been discussed in reference to overlay, the borders or edges of a line have to be determined at the highest possible degree of precision. Reason why commonly a SEM (CD-SEM) is used to obtain the necessary spatial resolution for this task. Edge detection by means of obtaining the first derivative of Gaussian type of functions is a known per se procedure, widely used in many fields such as electronic image processing, digital signal processing and others. Due to the before described stylus probe geometry dependency, an AFM is not directly usable for edge detection.

Mathematically, the dependency of edge detection location upon the spread can be deducted as follows by further derivation of the before mentioned first derivative of the Gaussian function.

The second derivative of the Gausssian equation is expressed as:

$$G''(x) = A\overline{l}^{-\frac{x^2}{2\sigma^2}} \left[ \frac{x^2}{\sigma^4} - \frac{1}{\sigma^2} \right] \quad G''(x) = 0 \text{ for } x = \pm\sigma$$

Meaning the second derivative is equal to zero for x=±σ. Or in other terms, the position of the edge is substantially dependent upon the spread, or stylus probe geometry. As previously has been noticed, spread is substantially dependent upon stylus probe geometry. Thus, although the AFM is capable of generating highly accurate data from the scanned surface with very high spatial resolution, the data is not absolute and can only be used in relative terms. It is therefore appreciated to notice that the monitoring of CD by means of an AFM is achieved by monitoring changes in CD data.

Figure 8:
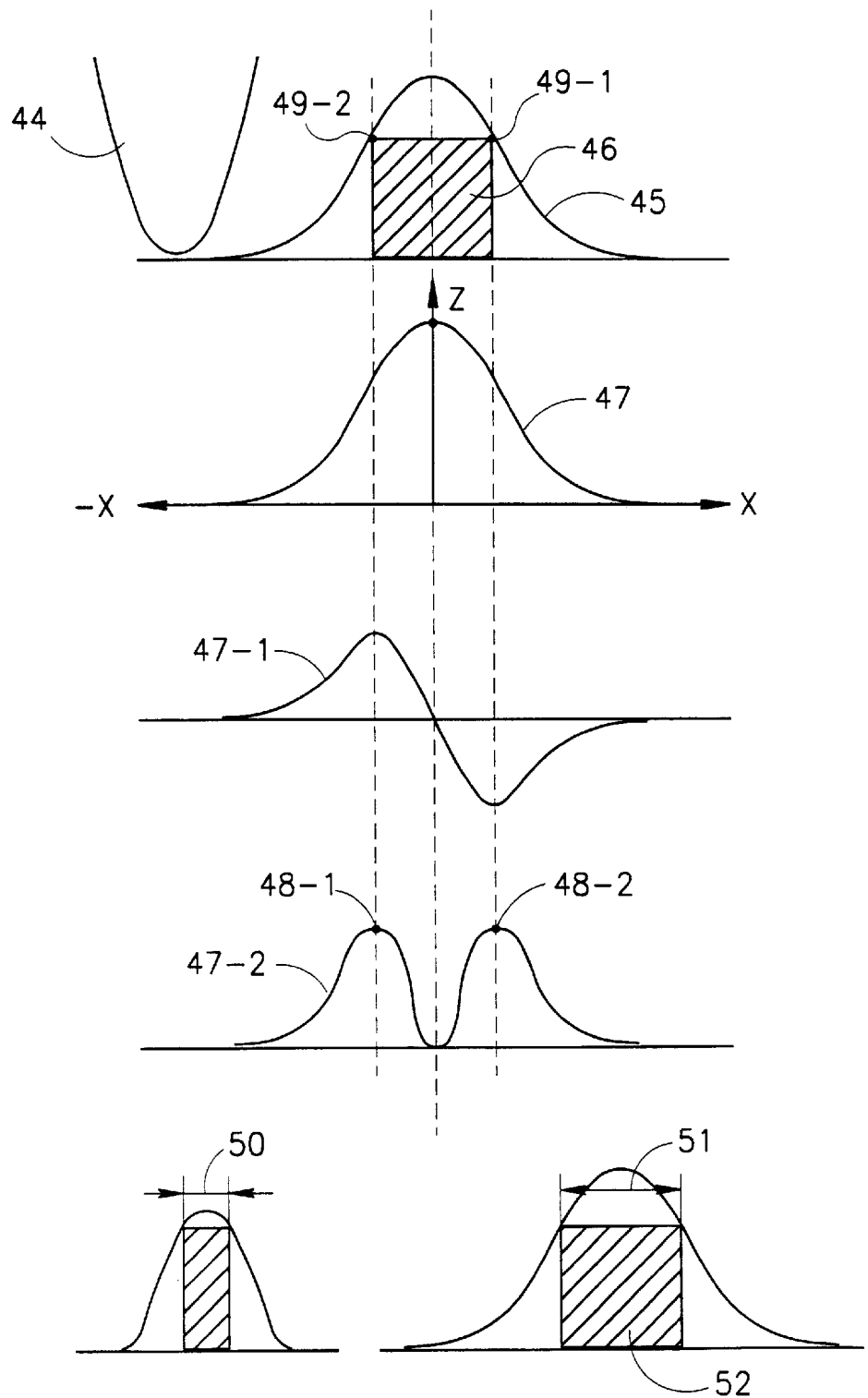
FIG. 8 is a schematic representation showing the procedure of width determination of a scanned mark and measuring two lines for CD inspection, according to one embodiment of the present invention.

In FIG. 8 the stylus probe 44 generates scanline 45 of line 46. As discussed earlier, the scanline can be approximated substantially by a function with Gaussian properties 47. Applying edge detection algorithm by means of calculating the first derivative of the scanline data results in waveform 47-1. Waveform 47-2 is the absolute form of 47-1, exhibiting two maxima 48-1 and 48-2, representative of the abscissae-values of both edges of the scanned line 46. Accordingly, the edge positions 49-1 and 49-2 have been determined. Accordingly, a relative width measurement 50, indicative of CD has been achieved by calculating the distance between said edge positions 49-1 and 49-2.

The CD-AFM monitoring is accomplished by detecting changes in width between current measurement, shown as 50 and another width measurement 51 of a second mark or line 52. The second mark or line 52 that can be situated in several places. In one embodiment, the mark 52 is at a different position on the same wafer (a die, situated for example five steps to the right of the current one) or, the mark 52 is the line, situated at the same die location on a different wafer. It is appreciated that the reference width measurement referred here as 51 can be also be stored in memory and thus recalled at appropriate time and moment. In a preferred embodiment of the present invention, the AFM is utilized as a process control tool that will monitor changes in line width and is responsive to changes in these values.

In one embodiment of the invention, the CD-AFM is used in conjunction with the previously mentioned FEM procedure. At the set-up of the process, the centered width (the overlay AFM procedure, described previously) is correlated to the actual CD measured by other means, such as CD-SEM, or cross section with the use of FIB (Focused Ion Beam) metrology [14], incorporated here by reference. It is then possible to correlate changes in the actual width, obtained by other means, with the width changes the AFM generates. A FEM-AFM look up table is created that correlates FEM results with the AFM results, so that information is obtained about how each AFM width measurement will look like for each FEM value. Thus, when a change in the measured width is detected, one can refer to the look up table and right away know whether the problem is focus or exposure. It is appreciated that in another embodiment aforementioned procedures can optionally be controlled and executed automatically and in feedback mode by various computer modules further on described in more detail.

The AFM 53 in FIG. 9 outputs the CD data, in another embodiment, via a known per se interface module, to a decision module 54, which forms part of a computer program or recipe that is run on a computer system that controls the electronics and robotics of the track 55. If the decision module 54 determines that the widths have changed in value since the measurement of previous wafer, the computer program will check if the change is within predefined tolerances. If the changes are not within set tolerances, an appropriate robotics command can be send to the track to move the wafer to stripping station 56. It should be noted that one or more of the previous measurements and/or apriori stored data constitute preferable reference CD data that serves for comparison against the currently obtained CD data. As has been discussed previously for overlay data, generally, any set of values acquired by various methods of reference data assessment procedures of appropriate reference data assessment procedures can constitute reference data for above mentioned purpose. In addition, a correction signal, constituting required change in stepper data (focus setting or exposure value or both) is optionally sent to the stepper electronics in order to ensure that the following stepper exposure step will be within predefined CD specifications.

In the case that the changes are within the tolerances, the wafer is moved optionally to the post-bake station 57 or directly to the unloading station 58.

As before, regardless of whether the changes are within tolerances or exceed them, the CD data is optionally logged and can be used for e.g. trend analysis and equipment performance statistics to enhance MTBF (Mean Time Between Failure), Process Control optimization, etc.

As before the present invention is by no means bound to the specific CD procedure described with reference to FIGS. 7 through 10.

There follows now a description of the AFM integrated into the track.

Figure 10:
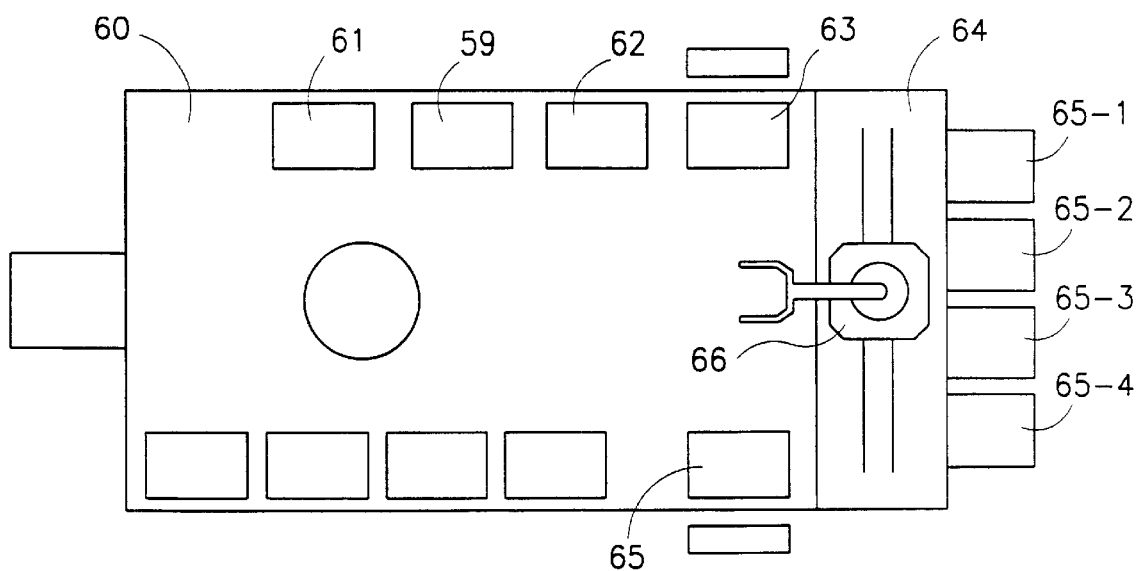
FIG. 10 is a schematic representation of a track where the AFM inspection tool is integrated in-track, according to one embodiment of the present invention.

In a preferred embodiment of the present invention, the AFM 59 in FIG. 10 is integrated into the photolithographic track 60 past the development station 61 and before the post-baking station 62 prior to unloading the cassette at the unloading station 63.

For completeness, FIG. 10 also shows a mini-environment 64, which is added to the track to accommodate 300 mm wafers that do not use the regular cassettes. The mini-environment station 64 occupies an entire side of the track and having up to four load locks 65-1, 65-2, 65-3 and 65-4 for up to four wafer pods. The wafers from the wafer pods are transferred to the track using a track robot 66, such as sold by Equipe of Santa Clara Calif. The track robot 66 extracts a wafer from one of the pods and transports the wafer to the standard loading station 65. Likewise, the track robot 66 transports a wafer from the unloading station 63 back to its original pod.

Those versed in the art will readily appreciate that the present invention is by no means bound or limited to the track as described with reference to FIG. 10, but can be implemented in various track topology schemes used in the field of integrated circuits manufacturing.

Traditionally, one overlay inspection station serves about five steppers. Because the throughput of a prior art overlay inspection station is not high enough to facilitate inspection of every wafer of each stepper, wafers are sampled from each stepper and transported to the overlay inspection station. According to the invention, it is possible to accomplish overlay and CD (variation) inspection of preferably, but not necessarily, each wafer. This is accordingly achieved as one (or more, according to needs) AFM inspection station(s), situated on the track of each stepper, is (are) available for this purpose. It should be noted that the track can accommodate a multitude of various stations. Additional stations can reside on a platform above the platform where the before mentioned stations are situated. Thus, there are virtually no physical limitations to install multiple AFM inspection stations on the track.

To achieve further improvements in throughput and accomplish real time monitoring of each wafer, several non limiting embodiments, which can be applied in combination or alone, will be discussed now and comprise of methods and systems used to operate an AFM in the present invention.

Figure 11:
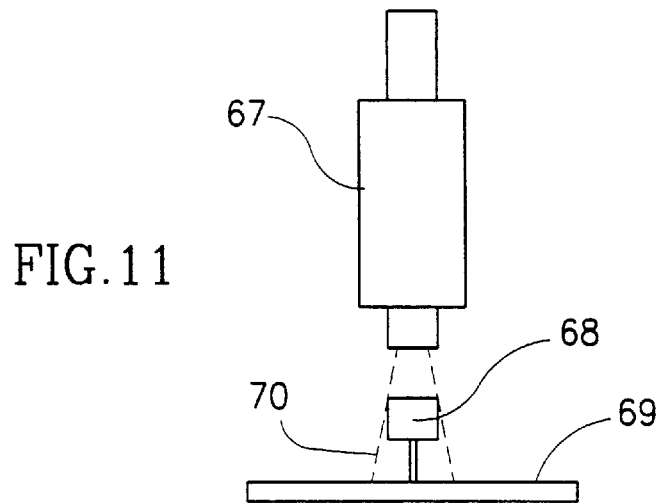
FIG. 11 is a schematic representation of the head of an AFM, including an optical microscope for providing position aid.
Figure 12A:
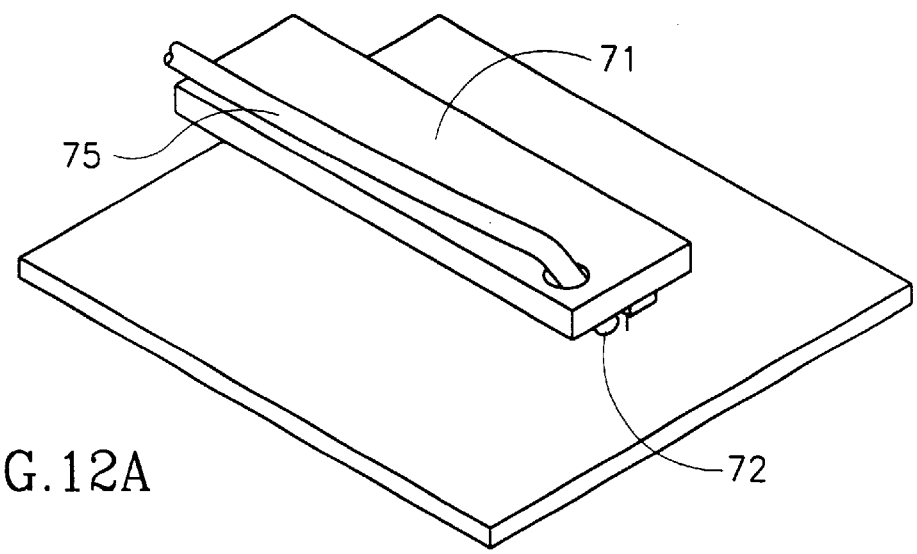
FIGS. 12A–12B are schematic representations of an AFM head, on which a endoscopic type of microscope is attached, according to one embodiment of the present invention.
Figure 12B:
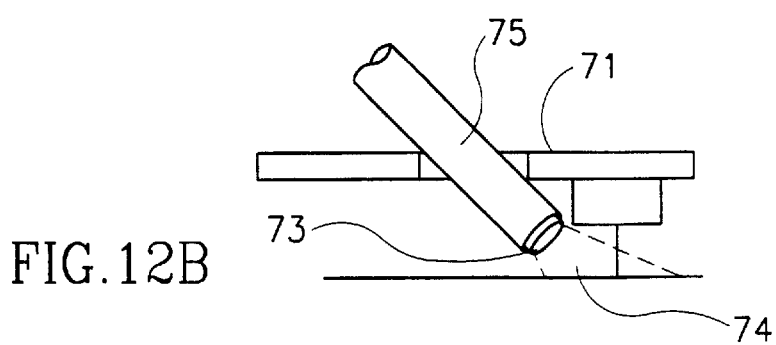

It is inherent to the high magnification of the AFM that the field of measurement is very small. Therefore, there exists a need to have an accessory tool available that provides the means to locate the area the stylus probe of the AFM has to measure. In addition, this tool must also correlate the position of the found area with the precise position of the stylus probe. A known per se method and system is described and incorporated here by reference in patent U.S. Pat. No. 5,117,110 [15] wherein the employment of an optical microscope, having inherently a large field of view, in combination with an AFM stylus probe is discussed, thus making it possible to observe the same point with both device. Another possibility is the incorporation of an optical profilometer and stylus probe measuring device into the same instrument as described in patent WO 98/30866, here incorporated by reference [16]. Conceptually, the combination of the two devices is shown in FIG. 11 where an optical microscope 67, situated above the stylus probe 68 of an AFM is used to locate the area on the wafer 69 that is to be measured. The field of view 70 of the optical microscope 67 includes the AFM head that holds the stylus probe 68 and thus facilitates in locating the area of measurement. As these solutions are applied to substantially stand alone devices, other means of positioning the AFM head have to be deployed when the AFM is mounted on the track, due to inherent real-estate confinements. Noticeable is also the requirements of remote control and monitoring, which are discussed further on. As the preferred embodiment of the invention is the deployment of an AFM onto the track, inventors have incorporated onto the arm of the AFM stylus probe, 71 in FIG. 12, an miniature optical microscope 72, that by means of miniaturized optics 73 as used in known per se endoscopic imaging equipment, project the obtained image of the field of view 74 of said miniature optical microscope onto the faceplate of a linear fiber cable 75. A known per se linear fiber or coherent fiber, comprising of spatially aligned fibers, permitting optical relay of the image to a preferable known per se CCD camera that generates a signal, indicative of the area the stylus probe is currently measuring. A display device such as a standard CRT monitor is used for generating the visual image. Optionally, human control, based on the image on the CRT can guide the stylus probe to the required area of interest. Another embodiment enables automatic positioning of the AFM stylus probe by means of using a pattern recognition algorithm module that compares the image obtained by the before mentioned CCD camera with a stored reference image and is connected to a positioning controller that directs the stylus probe head to the required area, using the coordinates that were computed by the pattern recognition algorithm module. According to another embodiment, a rotatable disk is incorporated into the wafer holding assembly so as to enable the wafer to be rotated and positioned for the stylus probe(s) to access any angular segment on the wafer. It is appreciated that the positioning controller receiving positioning data from the pattern recognition algorithm module controls the turntable.

The traditional mode of making a AFM measurements is to scan a line a predefined number (e.g. 10) of times and averaging the resulting data, thus making the time requirements substantial and thus the underlying observation of prior art overlay and/or CD inspection that, commonly, operates in sampling mode in order not to create bottlenecks and maintain acceptable throughput of the entire production system. By applying the current invention and its embodiments as described further on, said sampling mode can be replaced by one-on-one inspection without substantially decreasing throughput of the production and ultimately increasing throughput as waste and defects percentages are lowered. It is also appreciated to notice the optionally feasible automatic mode of the entire AFM overlay or/and CD inspection. To achieve this, several options are now described by means of example and in accordance with several embodiments. As mentioned before, the current invention is by no means bound to the specific embodiments further on described.

One embodiment has been described before and encompasses the mounting of multiple AFM inspection stations on the track.

Figure 13A:
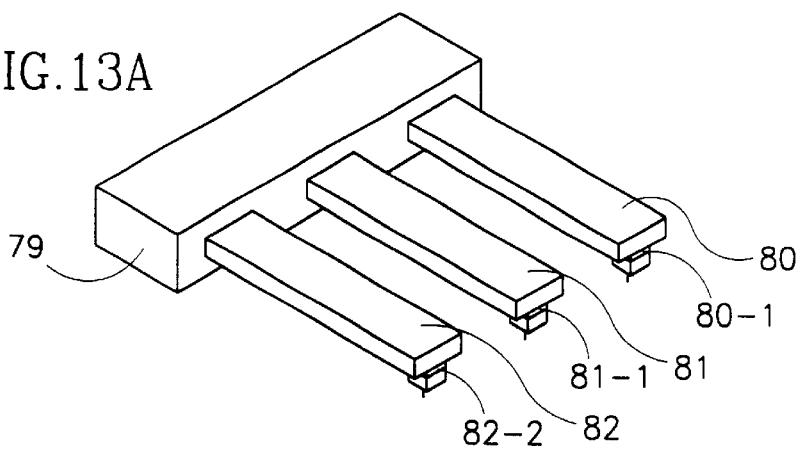
FIGS. 13A–13D are schematic representations of a multiple head AFM and means of moving multiple heads with multiple stylus probes independent of each other, including means of accessing every sector or area on a wafer.
Figure 13B:
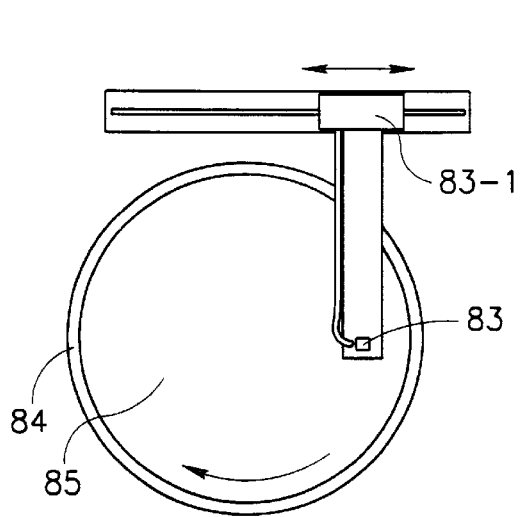
Figure 13C:
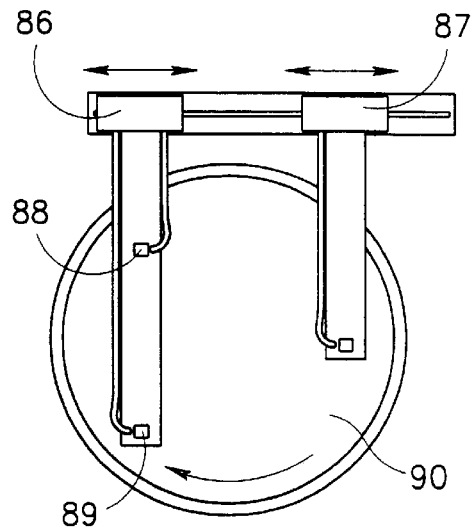
Figure 13D:
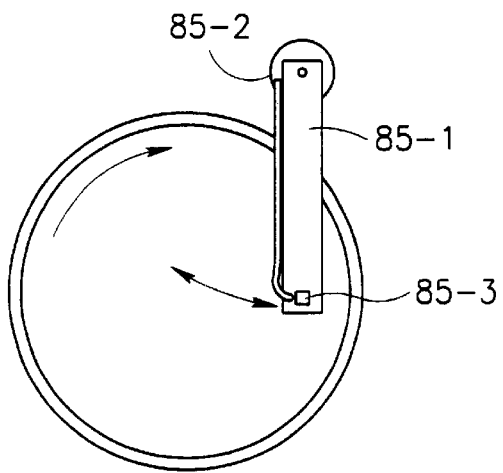

It is appreciated that the AFM head base 79 in FIG. 13A can have multiple scanning stylus probe arms, holding stylus probes 80, 81 and 82, independently positionable, which will substantially shorten the time it takes to scan the areas to be measured. Final precise positioning can be achieved having the stylus probe mounted on a known per se piezo-electric base module 80-1, 81-1 and 82-1, each situated between the arm and the stylus probe. This piezo-electric base module is capable of inducing minute spatial positioning movements as applied in prior art CCD imaging capturing devices. If, as said before, commonly 10 scans are required for making use of the AFM data, the three stylus probes depicted need to scan only three times in order to get 9 profile data sets, sufficient for monitoring. Another possibility is to move the AFM head 79 only half or third the distance between the stylus probes, thus achieving an interlace scan. Furthermore, it is possible to scan twice the same line by two different stylus probes, by moving the AFM base head 79 twice the distance between said stylus probes. This will help to eliminate inaccuracies caused by differences in probe geometry. Thus waveforms of two probes can be averaged and a base line can be extracted to reduce equipment noise from the waveforms of all the probes. The previously mentioned piezo-electric base module is in addition noticeable useful for achieving fast multiple scans in order to achieve the required numbers of scans for accurate measurements. By applying appropriate electrical signals to the piezo-element, the stylus probe will move laterally and thus enabling almost instantly further scanning. FIG. 13B shows an stylus probe that by means of a parallel movable arm 83, controlled by a known per se linear motor 83-1, or optionally by piezo-electrics, and the use of a turn table 84, on which the wafer 85 is placed, is able to access every sector on the surface of the wafer. This turntable, situated in the wafer holding module, is similar to known per se wafer turntables used for spinning the wafer at various stations on the track, as has been described earlier, but uses for turning the wafer a very precise angular motion controlled motor, preferably a linear motor, capable of turning its shaft in steps, which are less than a fraction of a degree. FIG. 13D shows another embodiment, wherein an stylus probe 85-1 with optionally a multitude of stylus probes is mounted on a phonograph type of arm, which pivots around the axis 85-2 of the arm's base. It is appreciated that appropriate rotational positioning module 85-3, situated between the arm of the AFM head and the piezo-electric base module, is included in this embodiment to ensure perpendicular scanning of marks and of lines, independently of angular stylus probe position. Thus it is guaranteed that scanlines will dissect object perpendicular and consequently enable repeatable and accurate width measurements. If required, additional AFM heads can be mounted onto the station, provided the multitude of arms will not obstruct each other by conflicting positions of each arm in relation to others. This can be achieved by e.g. a coordinating positioning controller, coupled to the arm movement module that coordinates and resolves conflicting positioning situations.

To provide independent and precise feedback of the exact current location of the stylus probe, in another embodiment, small mirrors are mounted on the stylus probe head and with the help of a known per se interferometer setup, using a small laser, information representing substantially independent location of the stylus head is obtained, that together with all positioning and coordinating modules represent a dependable and precise system of multiple head positioning management. Further use of the implementations of the inherent small dimensions of an AFM head is the embodiment of multiple arms 86 and 87 with multiple stylus probes 88 and 89 as shown in FIG. 13C. The stylus probes can thus simultaneously and independently scan different areas of the wafer 90. This particular embodiment is generally useful and time saving when the wafer under inspection comprises memory devices featuring repetitive patterns, which are not found on logic devices. As before, appropriate means have to be provided to ensure conflicting positioning of AFM heads.

It is accordingly appreciated that by implementing one or more embodiments described above, in almost every situation a solution can be found to enable one-on-one overlay and/or CD inspection of wafers in a variety of fab topologies.

Figure 14:
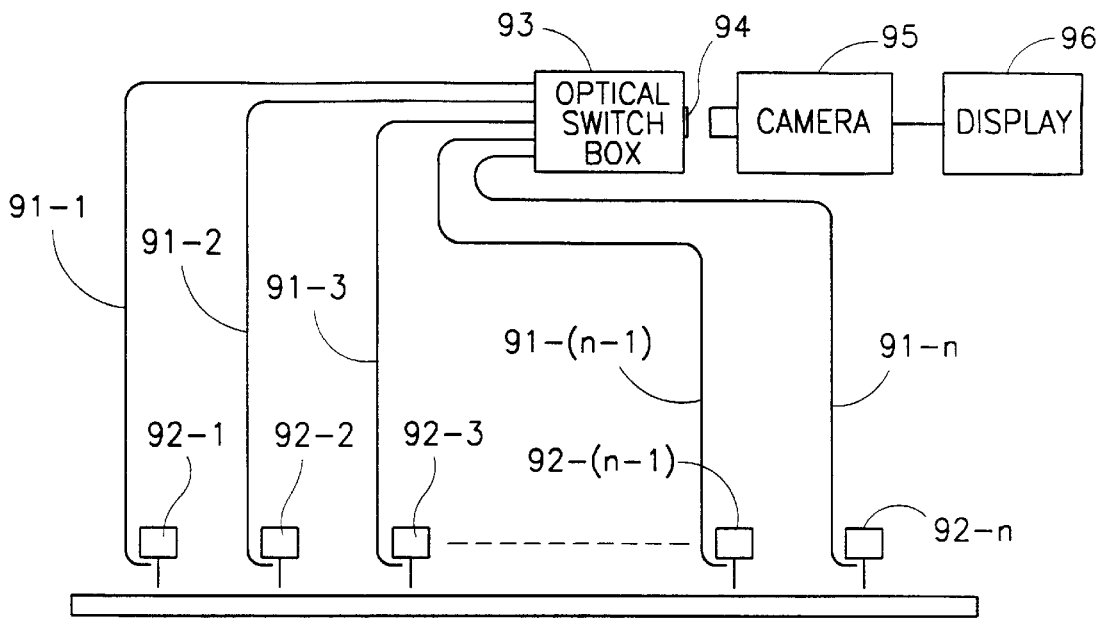
FIG. 14 is a schematic representation of one embodiment that shows means of managing multiple images from multiple areas being scanned and FIG. 15 is a schematic representation of another embodiment that shows means of managing multiple images from multiple areas being scanned, using multiple cameras.

There follows now a brief discussion with reference to FIGS. 14 of two out of many possibilities of managing the images from the multiple areas that the AFM heads, substantially concurrently, are scanning.

In one embodiment of the present invention every linear fiber cable 91-1, 91-2, 91-3, and 91-n originating from each AFM stylus probe head 92-1, 92-2, 92-3, and 92-n respectively, relays its field of view (FOV) image to a optical switching module 93. This module is capable of selecting either each fiber 91-1, 91-2, 91-3, and 91-n to the output faceplate 94 of the module, opposite camera 95, individually, or as in another embodiment, arranges every image from each fiber in a mosaic manner onto the faceplate 94, so that on display 96 all areas currently being inspected are displayed simultaneously side by side.

Figure 15:
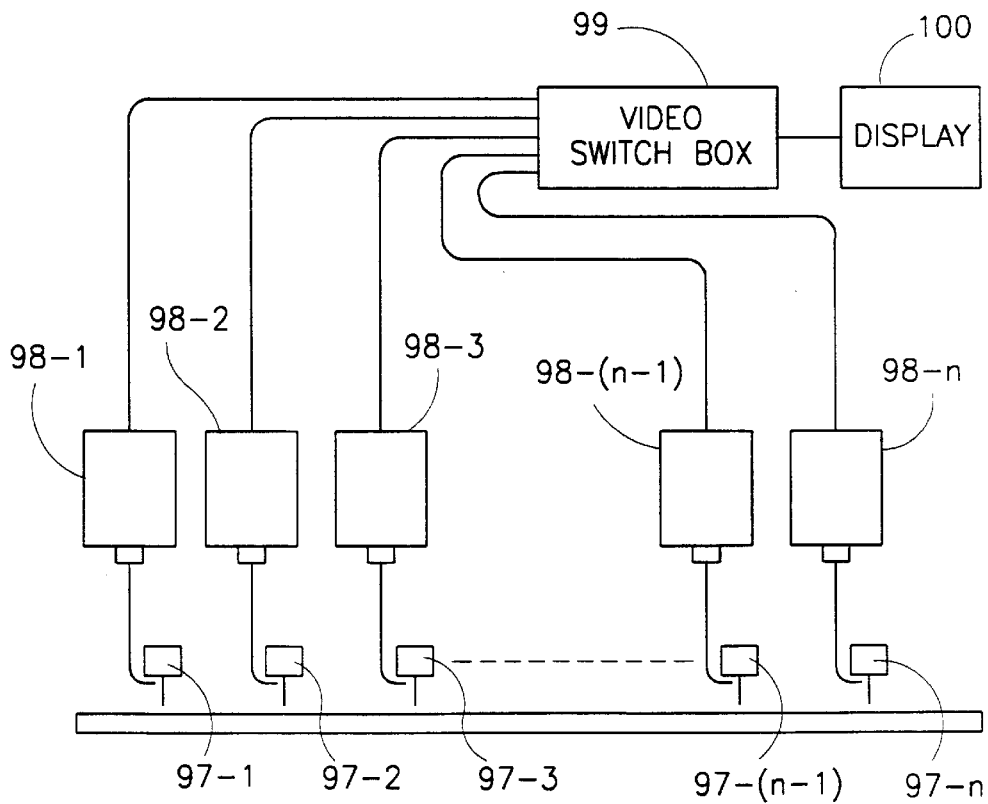

According to another embodiment (with reference to FIG. 15), every linear fiber cable originating from each AFM stylus probe head 97-1, 97-2, 97-3, and 97-n respectively, relays its field of view (FOV) image to its own camera 98-1, 98-2, 98-3, and 98-n. The video output of each camera is connected by to a video switching module 99 that in conceptual similar manner as described above in reference with optical switching module 93 in FIG. 13 can display either each image individually, or in mosaic manner, all simultaneously. It is appreciated to notice that the video switching module is capable of generating from the electrical signals a composite signal that represents in a mosaic manner the visual output of the cameras to the display output module. Those versed in the art will readily appreciate that the embodiments in reference to FIGS. 14 and 15 are only few out of many possible variants for multiple AFM heads and display options which assist in locating the area on the wafer that is to be measured. It should be noted that the specified positioning aids may be operated manually, semi-manually or automatically.

Using an AFM as a CD or/and OL measurement tool according to the present invention brings about the following advantages (versus conventional OL and/or CD-SEM inspection tools):

1. Compact dimensions;
2. Simple electromechanical instrument, simple to operate;
3. No contamination of wafer due to exposure to the electron beam of the SEM;
4. No vacuum chamber required;
3. The AFM, due to its inherent high-resolution capabilities is not susceptible to errors that result from TIS (Tool Induced Shift), or difficulties, resulting from low-contrast images due to use of CMP.
4. Extendable to next-generation lithography (such as electron and X-ray lithography.)
5. Adaptable to Scanning Capacitance Microscopy (SCM) mode to enable monitoring when metal lines are located at consecutive levels beneath dielectric layers by measuring the tip-to-sample capacitance change at the tip vibration frequency 6. Potential solution to the following problems that are inherent to optical OL measurements:
   (a) TIS errors of optical tool
   (b) Process target: Low-contrast/CMP layers (down to 0.01 nm layer height)
7. Due to the non-destructive nature of the OL and CD measurements using the AFM and further considering the closed loop option utilized with the AFM of the invention, a sampling rate may be selected depending upon the specific requirements, including:
   (a) One-on-one (all wafers)
   (b) Number of measurements per wafer
   (c) Variable sampling rate (number of wafers per batch inspected)

As mentioned before, the available space next to the track in the clean room is very confined and scarce. In-track AFM monitoring due to its small space requirements becomes now possible and accordingly, there are to the person versed in the art immediate and obvious advantages apparent. Only after having detected variations, the wafer(s) in question is (are) optionally transferred to a known per se high-resolution CD-SEM or to an optical OL microscope for further inspection.

An AFM that is incorporated onto the track of the photolithographic step of the semiconductor manufacturing line of integrated circuits, bringing additional advantages of which the following is a partial listing. The person versed in the art might find many other advantages that the present invention and method of the invention can bring about.

1. Integrated tool. Due to its compact size, the AFM is integrated as a station on the track.
2. Closed-loop, on-line, and real-time feedback process control. A feedback module that includes the previously mentioned decision module generates a signal to the track system control in case of changes in OL or/and CD variance, causing the track to move the wafer to the stripping station (FIG. 9, element 56) instead of to the post-baking 57 or unloading station 58 of the track 55.
6. Process control. The feedback module can e.g. send the overlay error indication signal to a FEM module, previously described to generate a new and changed matrix for the stepper. The wafer is returned to the stepper after stripping and exposed again. This procedure will continue until OL specifications are met. The overlay error indication can also be sent to an overlay matrix module that, similar as the FEM, generates a matrix of positional variances on-line for the Stepper. All these on-line procedures are important steps for better process control.
4. Enables unattended adjustments and uniformity checks for reduced maintenance and increased up time.
5. Eliminating the transport of the wafers outside the track. By keeping the wafers inside the track:
   (a) Contamination due to wafer handling and transport is reduced or even eliminated;
   (b) Time is saved by eliminating the transport procedures to and from the track.

The present invention has been described with certain degree of particularity.

Those versed in the art will readily appreciate that various modifications and alterations may be carried out without departing from the scope of the following claims:

1. A photolithography track system for semiconductor wafer manufacture, comprising:
   (a) an Atomic Force Microscope (AFM) that includes:
   a scanning stylus probe measurement device coupled to the AFM head, for measuring overlay between masks and respective layers in an inspected wafer, so as to generate overlay data;
   (b) said AFM is situated in-track to provide at least one station in said photolithography track system.

2. The system of claim 1, wherein said AFM operates in contact mode.

3. The system of claim 1, wherein said AFM operates in capacitance mode.

4. The system of claim 1, further comprising:
   (a) an optical microscope situated above and in correlation with the scanning stylus probe of said AFM, for viewing an area in the inspected wafer;
   (b) an electronic camera, coupled to said microscope for generating an electrical signal indicative of said area;
   (c) a display output module coupled to said camera for receiving said electrical signal and displaying images corresponding thereto.

5. A photolithography track system for semiconductor wafer manufacture, comprising:
   (a) an Atomic Force Microscope (AFM) that includes:
   a scanning stylus probe measurement device coupled to the AFM head, for measuring overlay between masks and respective layers in an inspected wafer, so as to generate overlay data;
   (b) said AFM situated in-track;
   (c) an interface module connected to said AFM to provide a bidirectional data link between said AFM and external systems.

6. The system of claim 5, further comprising:
   a decision module connected to said interface for comparing said overlay data with reference overlay data and for providing an overlay error indication in the case that said overlay data deviated from said reference overlay data.

7. The system of claim 6, further comprising:
   a feedback module coupled to said decision module and being responsive to said overlay error indication for activating an on-line feedback.

8. The system of claim 7, further comprising:
   a visual binary indication module coupled to said feedback module and being indicative of said overlay error indication.

9. The system of claim 8, wherein said indication module is visual numeric.

10. The system of claim 8, wherein said indication module is audible binary.

11. The system of claim 5, further comprising:
    a logging module coupled to said interface module, for logging at least part of said overlay data.

12. The system of claim 5, further comprising:
    (a) a pattern recognition algorithm module coupled to said interface module for generating an electrical signal indicative of alignment of said area and stored reference;
    (b) a positioning controller connected to said pattern recognition algorithm module for receiving said electrical signal indicative of coordinates of said area to position said scanning stylus probe in said area.

13. The system of claim 5, further comprising:
    (a) a parallel movable arm coupled to said AFM head, for moving spatially stylus probe head to said area;
    (b) a linear motor coupled to said arm for moving said arm;
    (c) a piezo-electric base module, situated between said arm and said stylus probe, for moving said stylus probe head in minute spatial movements and;

(d) a wafer turntable module connected to wafer holding module, for rotating said wafer to said angular segment of said area.

14. The system of claim 13, wherein said linear motor is a piezo-electric device.

15. The system of claim 13, wherein:
   (a) said parallel movable arm is a pivoted movable arm;
   (b) a rotational stylus probe positioning module, situated between the arm of the AFM head and the piezo-electric base module, for positioning said stylus probe in such a direction that scan direction is perpendicular to object direction, thus facilitating dissectional scanning.

16. The system of claim 5, further comprising:
   (a) a multitude of scanning stylus probe arms connected to said AFM head base; said scanning stylus probe arms movable independently relative to each other;
   (b) a coordinating positional module coupled to said each arm movement module for resolving conflicting multiple stylus probe arms positioning.

17. The system of claims 13, 14, 15 or 16, further comprising:
   (a) an interferometer to obtain precise and independent information of location of stylus probe;
   (b) a multitude of mirrors, each positioned on respectively each of said multitude of stylus probe arms and other suitable locations.

18. The system of claim 16, wherein said scanning stylus probe arms are in a rigged position relative to each other.

19. The system of claim 16, further comprising:
   (a) a multitude of endoscopic type of microscopes, each situated at one side of a coherent optical fiber cable to produce an image indicative of the area on the wafer said scanning stylus probe is currently measuring;
   (b) a multitude of said coherent optical fiber cables for transferring output of each said endoscopic type of microscope to the other ends of said coherent optical fiber cables;
   (c) an electronic camera for generating an electrical signal indicative of said area;
   (d) a display output module coupled to said camera for receiving said electrical signal and displaying images corresponding thereto;
   (e) an optical switching module coupled to said other ends of said coherent optical fiber cables to select and relay a single output of said endoscopic type of microscopes to said camera.

20. The system of claim 19, wherein the said optical switching module selects at least two of said coherent optical fiber cables to said camera simultaneously and to relay said outputs in a mosaic manner to said display output module.

21. The system of claim 19, wherein:
   (a) said electronic camera is a multitude of electronic cameras, each at one said other end of said coherent optical fiber cable for generating an electrical signal indicative of said area;
   (b) said optical switching module is a video type of switching module for connecting one of said electrical signals from each said camera to said display output module.

22. The system of claim 21, wherein said video switching module selects at least two of said electrical signals from each said camera to said display output module simultaneously and to generate from said electrical signals a composite signal that represents in a mosaic manner the visual output of said cameras.

23. The system of claim 4, wherein:
   (a) said external system is a FEM;
   (b) said decision module is connected to a look up table module for providing feedback information about FEM results.

24. A photolithography track system for semiconductor wafer manufacture, comprising:
   (a) an Atomic Force Microscope (AFM) that includes:
   a scanning stylus probe measurement device coupled to the AFM head for measuring Critical Dimension (CD) variations between lines in layers of an inspected wafer, so as to generate CD data;
   (b) said AFM is situated in-track to provide at least one station in said photolithography track system.

25. The system of claim 24, wherein said AFM operates in contact mode.

26. The system of claim 24, wherein said AFM operates in capacitance mode.

27. The system of claim 24, further comprising:
   (a) an optical microscope situated above and in correlation with the scanning stylus probe of said AFM, for viewing an area in the inspected wafer;
   (b) an electronic camera, coupled to said microscope for generating an electrical signal indicative of said area;
   (c) a display output module coupled to said camera for receiving said electrical signal and displaying images corresponding thereto.

28. A photolithography track system for semiconductor wafer manufacture, comprising:
   (a) an Atomic Force Microscope (AFM) that includes:
   a scanning stylus probe measurement device coupled to the AFM head for measuring Critical Dimension (CD) variations between lines in layers of an inspected wafer, so as to generate CD data;
   (b) said AFM situated in-track;
   (c) an interface module connected to said AFM to provide a bidirectional data link between said AFM and external systems.

29. The system of claim 28, further comprising:
   a decision module connected to said interface for comparing said CD data with reference CD data and for providing an CD error indication in the case that said CD data deviated from said reference CD data.

30. The system of claim 29, further comprising:
   a feedback module coupled to said decision module and being responsive to said CD error indication for activating an on-line feedback.

31. The system of claim 30, further comprising:
   a visual binary indication module coupled to said feedback module and being indicative of said CD error indication.

32. The system of claim 31, wherein said indication module is visual numeric.

33. The system of claim 31, wherein said indication module is audible binary.

34. The system of claim 28, further comprising:
   a logging module coupled to said interface module, for logging at least part of said CD data.

35. The system of claim 28, further comprising:
   (a) a pattern recognition algorithm module coupled to said interface module for generating an electrical signal indicative of alignment of said area and stored reference;

(b) a positioning controller connected to said pattern recognition algorithm module for receiving said electrical signal indicative of coordinates of said area to position said scanning stylus probe in said area.

36. The system of claim 28, further comprising:
   (a) a parallel movable arm coupled to said AFM head, for moving spatially stylus probe head to said area;
   (b) a linear motor coupled to said arm for moving said arm;
   (c) a piezo-electric base module situated between said arm and said stylus probe, for moving said stylus probe head in minute spatial movements and;
   (d) a wafer turntable module connected to wafer holding module, for rotating said wafer to said angular segment of said area.

37. The system of claim 36, wherein said linear motor is a piezo-electric device.

38. The system of claim 36, wherein:
   (a) said parallel movable arm is a pivoted movable arm;
   (b) a rotational stylus probe positioning module, situated between the arm of the AFM head and the piezo-electric base module, for positioning said stylus probe in such a direction that scan direction is perpendicular to object direction, thus facilitating dissectional scanning.

39. The system of claim 28, further comprising:
   (a) a multitude of scanning stylus probe arms connected to said AFM head base; said scanning stylus probe arms movable independently relative to each other;
   (b) a coordinating positional module coupled to each said arm movement module for resolving conflicting multiple stylus probe arms positioning.

40. The system of claims 36, 37, 38 or 39, further comprising:
   (a) an interferometer to obtain precise and independent information of location of stylus probe;
   (b) a multitude of mirrors, each positioned on respectively each of said multitude of stylus probe arms and other suitable locations.

41. The system of claim 39, wherein said scanning stylus probe arms are in a rigged position relative to each other.

42. The system of claim 39, further comprising:
   (a) a multitude of endoscopic type of microscopes, each situated at one side of a coherent optical fiber cable to produce an image indicative of the area on the wafer said scanning stylus probe is currently measuring;
   (b) a multitude of said coherent optical fiber cables for transferring output of each said endoscopic type of microscope to the other ends of said coherent optical fiber cables;
   (c) an electronic camera for generating an electrical signal indicative of said area;
   (d) a display output module coupled to said camera for receiving said electrical signal and displaying images corresponding thereto;
   (e) an optical switching module coupled to said other ends of said coherent optical fiber cables to select and relay a single output of said endoscopic type of microscopes to said camera.

43. The system of claim 42, wherein the said optical switching module selects at least two of said coherent optical fiber cables to said camera simultaneously and to relay said outputs in a mosaic manner to said display output module.

44. The system of claim 42, wherein:
   (a) said electronic camera is a multitude of electronic cameras, each at one said other end of said coherent optical fiber cable for generating an electrical signal indicative of said area;
   (b) said optical switching module is a video type of switching module for connecting one of said electrical signals from each said camera to said display output module.

45. The system of claim 44, wherein said video switching module selects at least two of said electrical signals from each said camera to said display output module simultaneously and to generate from said electrical signals a composite signal that represents in a mosaic manner the visual output of said cameras.

* * * * *